(12) United States Patent
Stefanov

(10) Patent No.: US 10,325,955 B2
(45) Date of Patent: Jun. 18, 2019

(54) CMOS IMAGE SENSOR WITH BACKSIDE BIASED SUBSTRATE

(71) Applicant: TELEDYNE E2V (UK) LIMITED, Chelmsford, Essex (GB)

(72) Inventor: Konstantin Stefanov, Cambridge (GB)

(73) Assignee: TELEDYNE E2V (UK) LIMITED, Chelmsford, Essex (GB)

( * ) Notice: Subject to any disclaimer, the term of this patent is extended or adjusted under 35 U.S.C. 154(b) by 0 days.

(21) Appl. No.: 14/645,728

(22) Filed: Mar. 12, 2015

(65) Prior Publication Data

US 2015/0263058 A1    Sep. 17, 2015

(30) Foreign Application Priority Data

Mar. 12, 2014    (GB) .................................. 1404363.2

(51) Int. Cl.
*H01L 27/146*    (2006.01)

(52) U.S. Cl.
CPC .... *H01L 27/14643* (2013.01); *H01L 27/1461* (2013.01); *H01L 27/1464* (2013.01); *H01L 27/14609* (2013.01); *H01L 27/14612* (2013.01); *H01L 27/14665* (2013.01); *H01L 27/14689* (2013.01)

(58) Field of Classification Search
CPC ........... H01L 27/14609; H01L 27/1461; H01L 27/14612; H01L 27/1464; H01L 27/14643; H01L 27/14665; H01L 27/14689
USPC .................................. 257/292, 223, 443, 438
See application file for complete search history.

(56) References Cited

U.S. PATENT DOCUMENTS

| 6,211,509 B1 | 4/2001 | Inoue et al. | |
| 7,518,171 B2 * | 4/2009 | Sze ................... | H01L 27/14603 257/288 |
| 7,763,913 B2 * | 7/2010 | Fan ................... | H01L 27/14603 257/233 |
| 8,829,637 B2 * | 9/2014 | McCarten .......... | H01L 27/1464 257/447 |

(Continued)

FOREIGN PATENT DOCUMENTS

| EP | 1551062 A2 | 7/2005 |
| JP | 2006-261638 A | 9/2006 |

(Continued)

OTHER PUBLICATIONS

Extended Search Report for European Patent Application No. 15158723.5 dated Jul. 22, 2015.

(Continued)

*Primary Examiner* — Mohammed Shamsuzzaman
(74) *Attorney, Agent, or Firm* — FisherBroyles, LLP; Robert Kinberg

(57) ABSTRACT

A CMOS image sensor 101 comprises an active layer 11 of a first conductivity type arranged to be reversed biased and a pixel 20 comprising a photosensitive element comprising a well 22 of a second conductivity type and a well 21 of the first conductivity type containing active CMOS elements for reading and resetting the photosensitive element. The CMOS image sensor further comprises a doped buried layer 111 of the second conductivity type in the active layer beneath the well of the first conductivity type. The buried layer is arranged to extend a depletion region below the well of the second conductivity type also below the well of the first conductivity type.

9 Claims, 13 Drawing Sheets

(56) References Cited

U.S. PATENT DOCUMENTS

| | | | |
|---|---|---|---|
| 9,548,307 B2* | 1/2017 | Mallikarjunaswamy | ................... H01L 27/0928 |
| 2002/0096621 A1* | 7/2002 | Yoneda | ............. H01L 27/14609 250/208.1 |
| 2006/0267053 A1* | 11/2006 | Yang | ................. H01L 27/14609 257/291 |
| 2007/0145239 A1* | 6/2007 | Mheen | ................... H04N 5/361 250/208.1 |
| 2008/0099807 A1* | 5/2008 | Kim | ................. H01L 27/14603 257/292 |
| 2008/0142714 A1 | 6/2008 | Nagai et al. | |
| 2008/0217723 A1 | 9/2008 | Lauxtermann | |
| 2009/0050998 A1 | 2/2009 | Miura | |
| 2010/0109060 A1* | 5/2010 | Mao | ................. H01L 27/14603 257/292 |
| 2011/0024808 A1* | 2/2011 | Janesick | ........... H01L 27/14609 257/292 |
| 2011/0095388 A1* | 4/2011 | Richter | ............... H01L 27/1446 257/432 |
| 2011/0291103 A1* | 12/2011 | Mazzillo | ........... H01L 31/03529 257/76 |
| 2012/0104464 A1* | 5/2012 | Janesick | ................ H01L 21/84 257/223 |
| 2013/0026594 A1* | 1/2013 | McCarten | ........... H01L 27/1464 257/443 |
| 2013/0207216 A1* | 8/2013 | Pierschel | ........... H01L 27/1446 257/438 |
| 2013/0270610 A1* | 10/2013 | Suess | ................ H01L 27/14643 257/258 |

FOREIGN PATENT DOCUMENTS

| | | |
|---|---|---|
| JP | 2007-335596 A | 12/2007 |
| JP | 2010-056345 A | 3/2010 |

OTHER PUBLICATIONS

Office Action for Japanese Patent Application No. 2015-049024 dated Oct. 24, 2018.

* cited by examiner

CMOS IMAGE SENSOR WITH BACKSIDE BIASED SUBSTRATE

CROSS-REFERENCE TO RELATED APPLICATIONS

This application claims priority to Great Britain Application No. GB 1404363.2, filed Mar. 12, 2014, the disclosure of which is incorporated herein by reference in its entirety.

This invention relates to a CMOS image sensor and an apparatus comprising the CMOS image sensor.

BACKGROUND

Silicon CMOS image sensors for imaging from infrared to soft x-rays are known. FIGS. 1 to 3 show equivalent circuit diagrams of known silicon CMOS image sensors using a photodiode, a pinned photodiode and photogate respectively, in which T1 is a reset transistor, T2 is a source follower, T3 is a row select transistor and T4 is a transfer gate. FIGS. 4 to 7 show corresponding cross-sections of known CMOS image sensors using a photodiode, a buried photodiode, a pinned photodiode and photogate respectively.

However, to form near-infrared images it is desirable to use a relatively thick silicon active layer, e.g. 100-200 µm, to provide sufficient absorption depth for the infrared radiation. It is known to apply a reverse bias across an active layer of CMOS image sensors to reduce crosstalk and improve quantum efficiency. However, because of the low operating voltages of CMOS image sensors, achieving full depletion can be very difficult for thick active layers e.g. over >20 µm and requires additional reverse biasing of the substrate. The thickness of an active layer of a CMOS image sensor is determined by the available voltage and silicon resistivity. For the highest available resistivity in CMOS currently available of approximately 1,000 ohm·cm for epi and with a 3.3V supply, a "thick" active layer means an active layer with a thickness that cannot be depleted under normal operating voltages—this corresponds to a thickness >20 µm or thereabouts. That is, currently full depletion with a 3.3V diode bias can be obtained only up to a thickness of approximately 18 µm with epi. In the case of bulk silicon the highest available resistivity is 10,000 ohm·cm and this could deplete up to around 50 microns. In either case, for greater thicknesses, depletion regions may be formed only under the photodiodes which would decrease quantum efficiency and cause crosstalk due to charge diffusion and slow charge collection. The applied reverse bias voltage may then cause a parasitic current to flow through the active layer around the depletion regions.

Referring to the cross-section of a known CMOS image sensor 10 shown in FIG. 8, the CMOS image sensor 10 comprises a p-epitaxial or bulk silicon active layer 11 on a p+ substrate or backside contact respectively 12, and pixels 20, each comprising CMOS active components (not shown) in a p well 21 and a photodiode with an n+ well 22 in a front side of the p-epitaxial or bulk silicon layer 11. The image sensor further comprises a guard ring n+ well 23 surrounding the pixels 21 and, if there is no backside bias contact, a substrate bias p+ well 24 on the front side at a distance A from the guard ring n+ well 23 greater than a thickness D of the image sensor 10 (it will be noted that FIG. 8 is not shown to scale).

Under the influence of the negative bias voltage, typically higher than −10V in absolute value, a current may flow through a resistive path 13 from the p wells 21 to the p+ substrate or backside contact 12. However, in use depletion regions 14, 15, 16 are formed in the active layer below the respective photodiode n+ wells 22, and these depletion regions may, in some circumstances, spread laterally below the p wells 21 to pinch off the current between the p wells 21 and the p+ backside contact 12 as shown in respect of depletion regions 14 and 15 but not in respect of depletion regions 15 and 16. Referring to FIG. 9, with some structures and operating conditions the depletion regions 15 and 16 form pinch-off 17 whereas under other conditions, for example when the photodiode has collected a charge under irradiation, the depletion region 15' may be smaller than depletion region 15 and no pinch-off occurs between depletion regions 15' and 16, allowing a parasitic current to flow.

As shown in FIGS. 10 and 11, the extent of the overlap of the depletion regions creating the pinch-off is dependent on relative doping levels and depths of the p-wells and n-wells. Referring to FIG. 10, with identically doped p wells 211 and n wells 221 of equal depth, and with the width $L_{nw}$ of the n well 221 greater than a width $L_{pw}$ of the p well 211, the depletion regions 151 and 161 may overlap to form a pinch off 171. Referring to FIG. 11, with identically doped p wells 212 and n wells 222 but with the n wells 222 deeper and wider than the p wells 212, a greater overlap may occur between neighbouring depletion regions 142, 152 and 162 to form wider pinch-offs 172.

Thus, a pinch-off 17 cannot be achieved under all operating conditions and may not be possible if the wells are deep or more highly doped than the photosensitive elements.

Although these effects have been described in a CMOS image sensor with a p-type substrate, it will be understood that the same effects occur in a CMOS image sensor with opposite conductivity type layers and wells.

US 2005/0139752 discloses a front-illuminated CMOS sensor in which a back bias voltage is varied to vary a width of a depletion area in the photodiode to adjust the sensitivity of the sensor to red, green and blue light without using a colour filter. The CMOS sensor has a photodiode region and a transistor region. An n-type buried layer, which may be horizontal or U-shaped, is formed in the p-type substrate below the transistor region to prevent the bias voltage affecting the transistor region.

US 2008/0217723 discloses a back-illuminated CMOS sensor with a pinned photodiode to collect charge carriers formed in the 5µ thick silicon substrate. In sensors in which reverse bias is applied a triple well may be provided below the transistor region so that the voltage applied to the transistors is unaffected by the bias voltage. In addition, a p-type buried layer beneath the transistor region may be provided to reflect charge carriers generated in the p-doped silicon substrate away from the transistor region and towards the photodiode region.

US 2011/024808 discloses a back-illuminated CMOS sensor with a deep n-well in a p-substrate beneath a CMOS logic region to generate a barrier for substrate bias. An n-well surrounding the pixels forms a depletion region around the edge of the pixels to ensure that the pixels pinch off substrate bias in proximity to a p+ return contact. To achieve substantially full depletion of the p-type epitaxial silicon layer, the layer may be of intrinsic silicon or lightly doped. A reverse bias voltage applied to a front contact causes a depletion region to extend to the full substrate thickness below the pixels.

There remains a requirement for an efficient method of preventing parasitic substrate current with a thick CMOS image sensor device structure formed with a minimum of processing steps.

BRIEF SUMMARY OF THE DISCLOSURE

In accordance with the present invention there is provided a CMOS image sensor comprising: an active layer of a first conductivity type arranged to be reversed biased and a pixel comprising: a photosensitive element comprising a well of a second conductivity type; and a well of the first conductivity type containing active CMOS elements for reading and resetting the photosensitive element; and a doped buried layer of the second conductivity type in the active layer beneath the well of the first conductivity type arranged to extend a depletion region below the well of the second conductivity type also below the well of the first conductivity type.

Advantageously, the doped buried layer is doped at substantially $10^{15}$ cm$^{-3}$ and the active layer has a doping level of $10^{13}$ cm$^{-3}$.

Conveniently, the doped buried layer is electrically floating.

Conveniently, a width of the doped buried layer of the second conductivity type is substantially equal to a width of the well of the first conductivity type.

Advantageously the CMOS image sensor comprises a plurality of pixels as described above and a guard ring comprising a well of the second conductivity type at least substantially encircling the plurality of pixels.

Conveniently, the pixel is on a front face of the substrate and the CMOS image sensor is arranged for illumination on the back face thereof, opposed to the front face.

Conveniently, the CMOS image sensor further comprises a contact on the back face arranged for applying the reverse bias to the CMOS image sensor.

Alternatively, the CMOS image sensor further comprises a contact on the front face arranged for applying the reverse bias to the CMOS image sensor.

According to a further aspect of the invention, there is provided an apparatus comprising a CMOS image sensor as described above.

According to a further aspect of the invention, there is provided a night vision apparatus comprising a CMOS image sensor as described above.

BRIEF DESCRIPTION OF THE DRAWINGS

Embodiments of the invention are further described hereinafter with reference to the accompanying drawings, in which.

DETAILED DESCRIPTION

Figure 12:
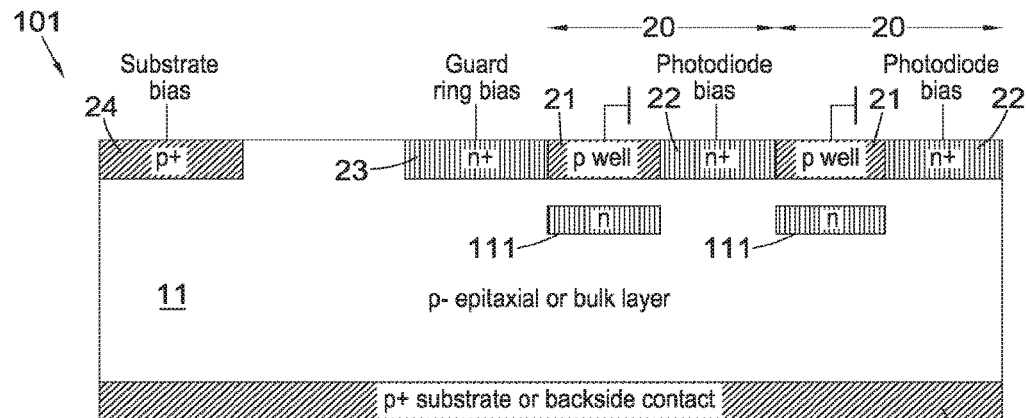
FIG. 12 is a cross-section diagram of a CMOS image sensor according to the invention with buried layers substantially the same width as the p-wells.

Referring to FIG. 12, a pinned photodiode CMOS back-illuminated image sensor 101, according to the invention, comprises a p+ substrate or backside contact 12 on which is a p-epitaxial or bulk active layer 11. Pixels 20 each comprising a photodiode located in an n+ well 22 and active devices for reading charge from the photodiode and resetting the photodiode in a p-well 21 on a front face of the epitaxial or bulk layer 11. A guard ring in the form of an n+ well 23 surrounds the plurality of pixels 20. A substrate bias contact is supplied by a p+ well 24 on the front face of the epitaxial or bulk layer 11 at a distance from the guard ring of at least the thickness of the active layer (FIG. 12 is not drawn to scale). Floating buried lightly doped n-layers 111, doped at, for example, $10^{15}$ cm$^{-3}$ compared with typical doping levels of $10^{13}$ cm$^{-3}$ for the active layer, are located beneath the p-wells containing the active devices. The depth of the buried n-implant is typically 2 to 3 μm, sufficient for the buried layer to be deeper than a depth of the p-well which is 0.5 to 1.5 μm deep, the same as the photodiode. Peak p-well concentration is $10^{16}$-$10^{17}$ cm$^{-3}$. The buried n-implant is shown approximately a same size as the p-well, but could be wider than the p-well. It is envisaged that the buried n-implant could be extended to be in weak contact with the photodiodes and not electrically floating.

A peak diode potential of a pinned photodiode is determined by doping levels of the diode and the pinning implant and is in the range of 1V to 2V for a 3.3V supply. The potential must not be so low as to limit full well capacity or so high as to make charge transfer slow and cause image lag. With a large capacitance diode the potential change at full well is of the order of 0.5V.

In a pinned photodiode structure with a floating diffusion layer between a transfer gate and a reset gate, the floating diffusion depletion should be fully contained within the p well otherwise the floating diffusion layer will compete for charge with the diode. This determines the doping and depth of the p well for a fixed floating diffusion voltage. The p well should be deeper than the shallow trench insulation, which typically has a depth of 0.31 μm. The p well is preferably deeper than the diode implant which increases the problem of reducing the substrate current. From studies with identical diode and p well doping, the p well width should be less than 2 μm.

It will be understood that the buried n-layer may be implanted using an ion beam of sufficiently high energy. If a typical manufacturing process for CMOS image sensors is assumed, the new implant requires only one additional step. In one implementation the buried n-layer is implanted before or after the p-well, using a same mask for alignment with the p-well. In another implementation the buried n-layer is implanted before or after the p-well using a different mask. In this case the new n-implant can have a different size from the p-well. Implantation before the p-well is preferred to avoid affecting parameters of transistors in the p-well.

Figure 13:
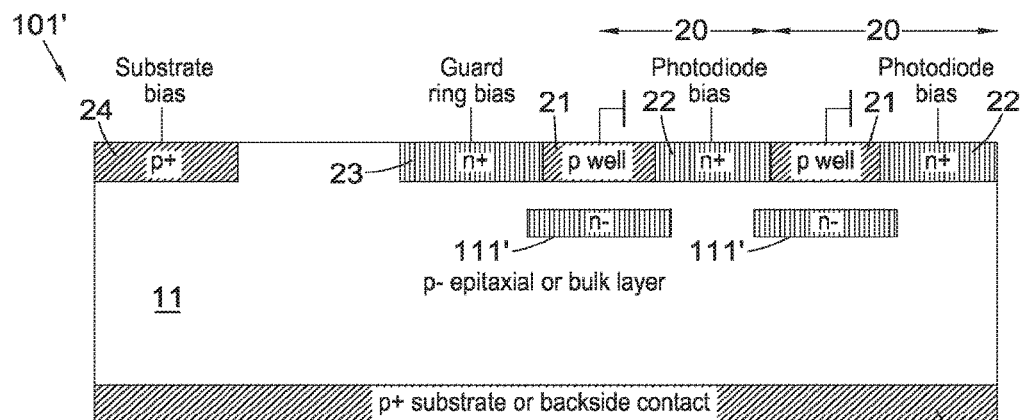
FIG. 13 is a cross-section diagram of a CMOS image sensor according to the invention with buried layers wider than the p-wells.

FIG. 13 shows a pinned photodiode CMOS back-illuminated image sensor 101', according to the invention, similar to the image sensor 101 of FIG. 12, but in which the buried n-layer 111' is wider than the p-well 21.

Figure 14:
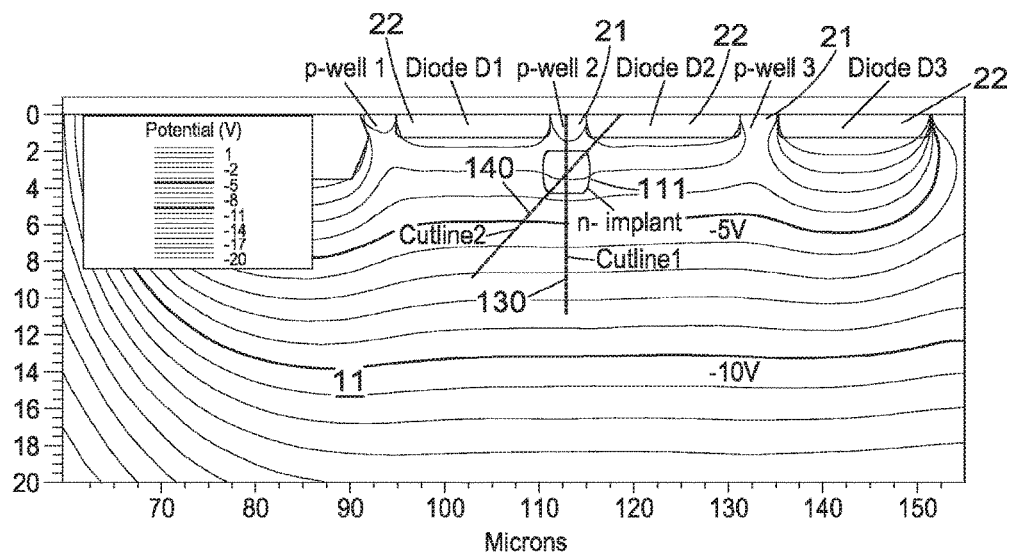
FIG. 14 shows potential contours within an active layer of a CMOS image sensor with a single buried layer.

FIG. 14 shows a simulation of potential contours of the CMOS image sensor of FIG. 12, in which the contour lines are at 1 V intervals. The potentials on the diodes D1 and D2 are set to 1.5V to match actual potentials in a four-transistor pinned photodiode. In this simulation, the p-type epitaxial or bulk layer doping is $10^{13}$ cm$^{-3}$, providing a resistivity of approximately 1 kOhm·cm. The doping of the n-implant is approximately $10^{15}$ cm$^{-3}$. If it is lower ($10^{14}$ cm$^{-3}$) it is ineffective because pinch-off does not occur, and if higher ($10^{16}$ cm$^{-3}$) a potential pocket is formed at the implant location. The doping of the photodiode is approximately $10^{16}$ cm$^{-3}$, and this sets the upper limit for the n-implant, above which a potential pocket is formed. The n-implant 111 has a depth of approximately 1 μm and is not in significant contact with the p-well, so that the p-well and the n-implant can be considered independent.

Figure 15:
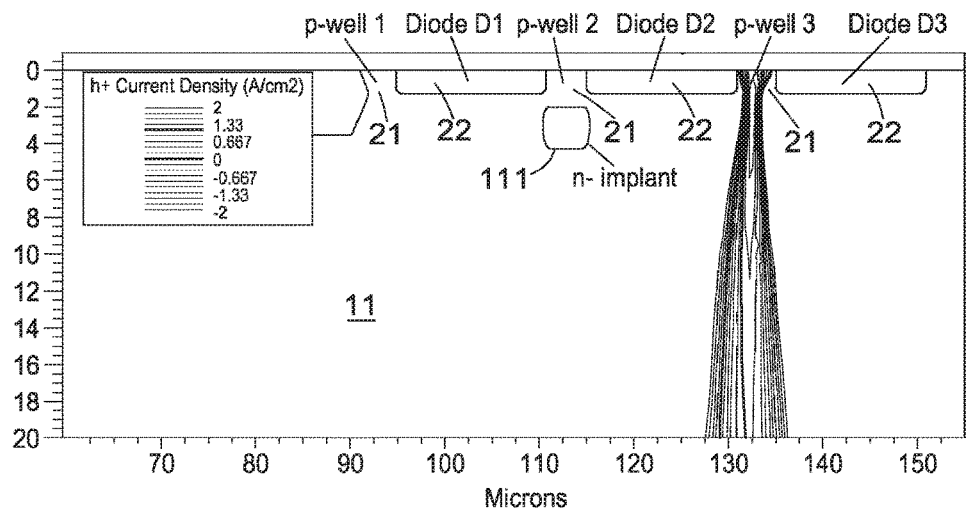
FIG. 15 shows current density contours within the active layer of the CMOS image sensor of FIG. 14.

FIG. 15 shows a hole current density with contours ranging on a logarithmic scale from $10^2$ A/cm$^2$ to $10^{-2}$ A/cm$^2$, corresponding to the potential contours of FIG. 14. A pinch-off is maintained where there is a lightly doped n-type floating buried layer 111 under the p-well 2 but the pinch-off is open, allowing a current to flow, under the p-well 3 with no corresponding buried n-layer. It may be that charge carriers are diverted to travel along the length of the buried layer 111. The effect of the lightly doped n layers allows substantially larger bias voltages of say −20V to be applied to thick substrates of, for example, 100-200 μm without causing parasitic currents between the p wells and the back side contact where present or the front side bias p+ well, as the case may be. Thus, pinch-off is maintained at much lower photodiode voltages which occur when large signals have been collected, than in the prior art, or when the p-wells are highly doped or deep. The parasitic substrate current is much reduced or eliminated in the CMOS image sensor of the invention.

Figure 16:
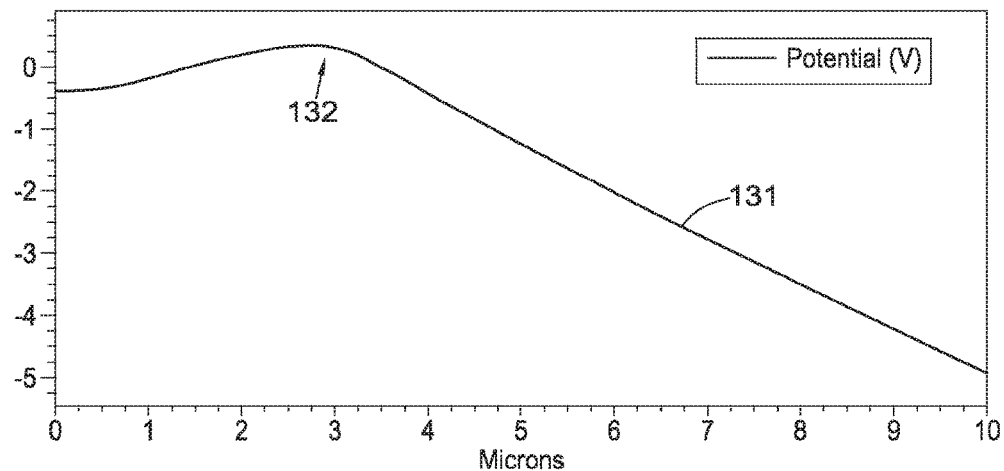
FIG. 16 is a graph of potential versus distance along the cutline 1 of the CMOS image sensor of FIG. 14.

FIG. 16 shows the potential 131 along the line 130 of FIG. 14 showing a potential barrier 132 preventing conduction to the p-well 2 with the buried layer 111. However, this barrier does not prevent charge from reaching the photodiodes 22 to the sides of p-well 2 with the buried layer 111.

Figure 17:
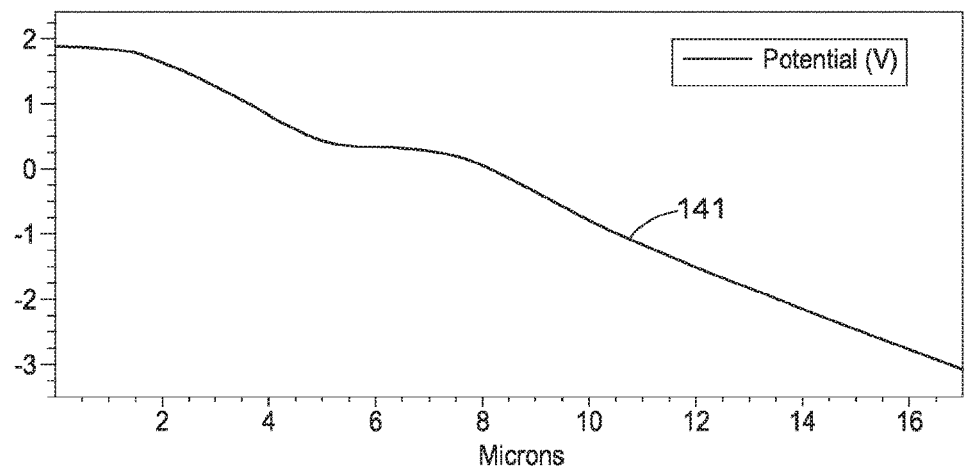
FIG. 17 is a graph of potential versus distance along the cutline 2 of the CMOS image sensor of FIG. 14.

FIG. 17 shows the potential 141 along the line 140 of FIG. 14 showing that there is no barrier between the photodiode D2 and the n-implant 111 and that charge will collect at the photodiodes 22. A potential pocket is not formed.

Although these effects have been described in a CMOS image sensor with a p-type substrate, it will be understood that similarly a CMOS image sensor with opposite conductivity type layers and wells may be provided. It will also be understood that the invention can be applied to both back and front illuminated image sensors of a first conductivity type in which the photosensitive element comprises a well of a second conductivity type, such as image sensors comprising a photodiode, a buried photodiode, a pinned photodiode or a photogate.

Figure 1:
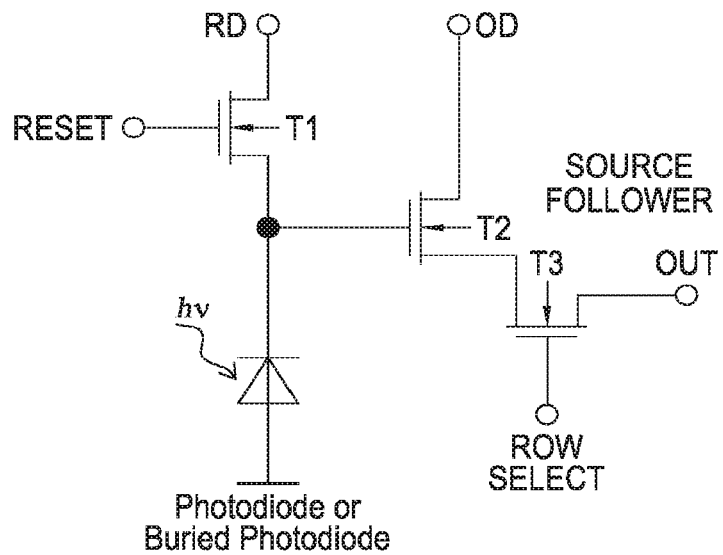
FIG. 1 is an equivalent circuit diagram of a known CMOS image sensor using a photodiode or buried photodiode.
Figure 2:
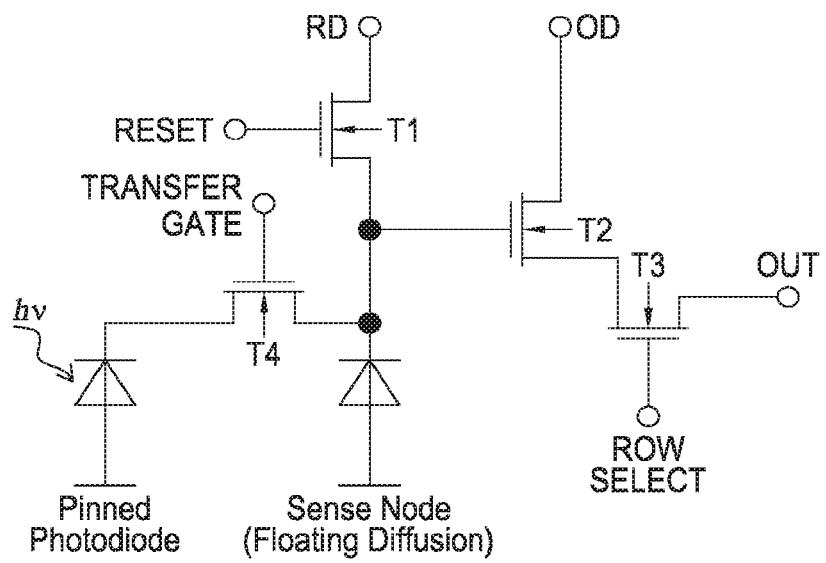
FIG. 2 is an equivalent circuit diagram of a known CMOS image sensor using a pinned photodiode.
Figure 3:
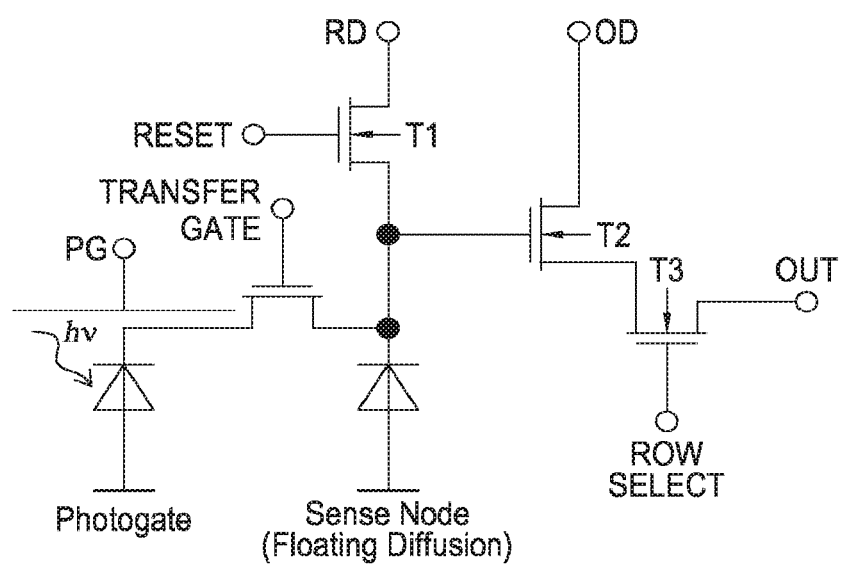
FIG. 3 is an equivalent circuit diagram of a known CMOS image sensor using a photogate.
Figure 4:
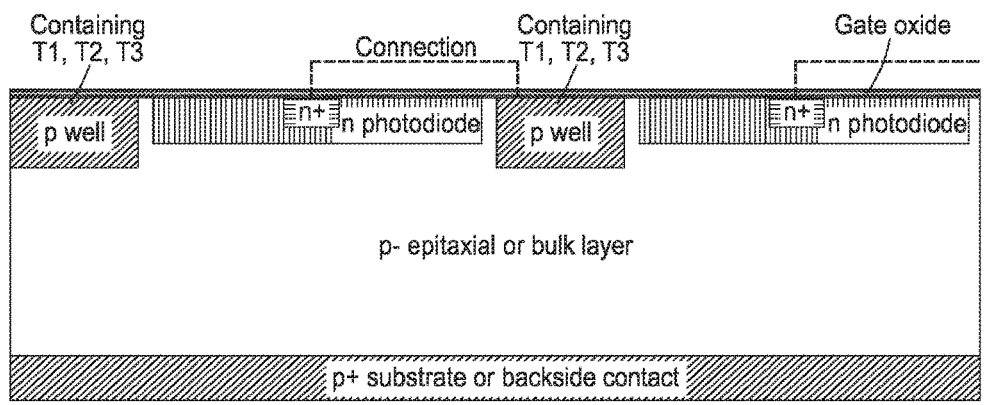
FIG. 4 is a cross-section diagram of the known CMOS image sensor of FIG. 1 using a photodiode.
Figure 18:
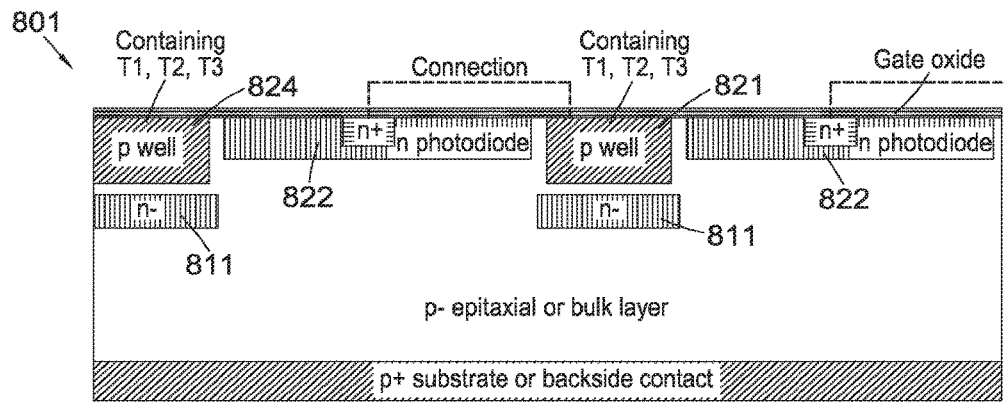
FIG. 18 is a cross-section diagram of a CMOS image sensor according to the invention comprising a photodiode.

Thus FIG. 18 shows a cross-section of an image sensor 801 comprising photodiodes 822 and buried n-layers 811 below p wells 821. Otherwise the image sensor is similar to the prior art sensor of FIG. 4.

Figure 5:
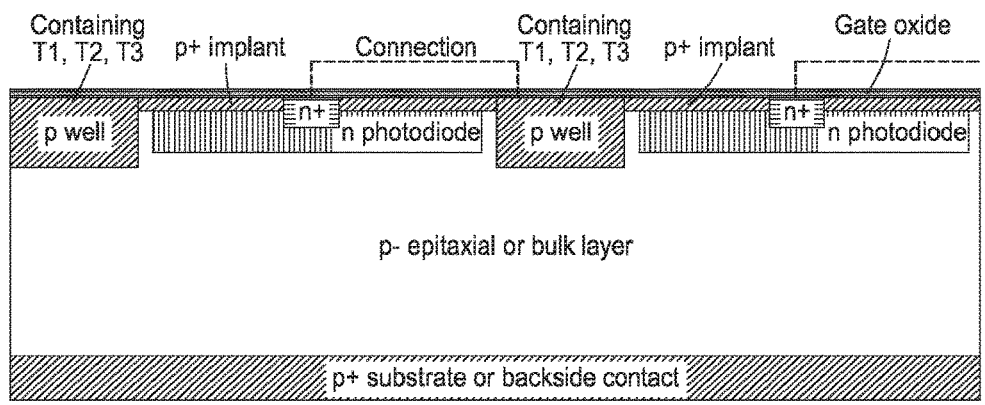
FIG. 5 is a cross-section diagram of the known CMOS image sensor of FIG. 1 using a buried photodiode.
Figure 19:
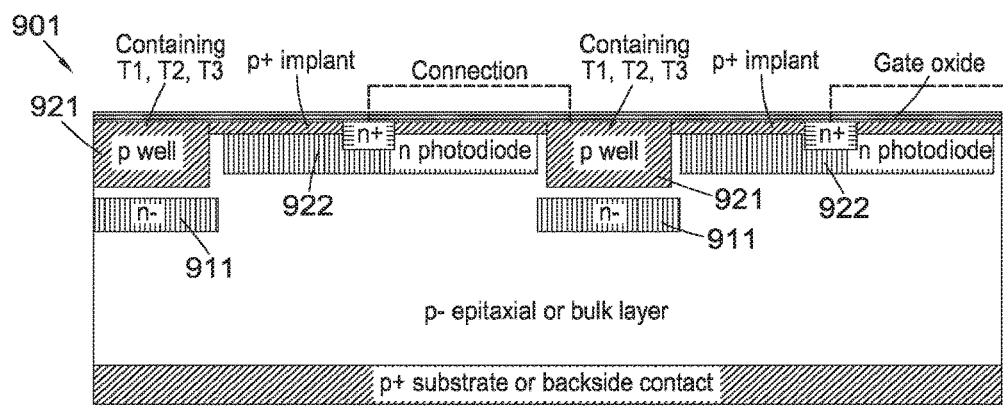
FIG. 19 is a cross-section diagram of a CMOS image sensor according to the invention comprising a buried photodiode.

FIG. 19 shows a cross-section of an image sensor 901 comprising buried photodiodes 922 and buried n-layers 911 below p wells 921. Otherwise the image sensor is similar to the prior art sensor of FIG. 5.

Figure 6:
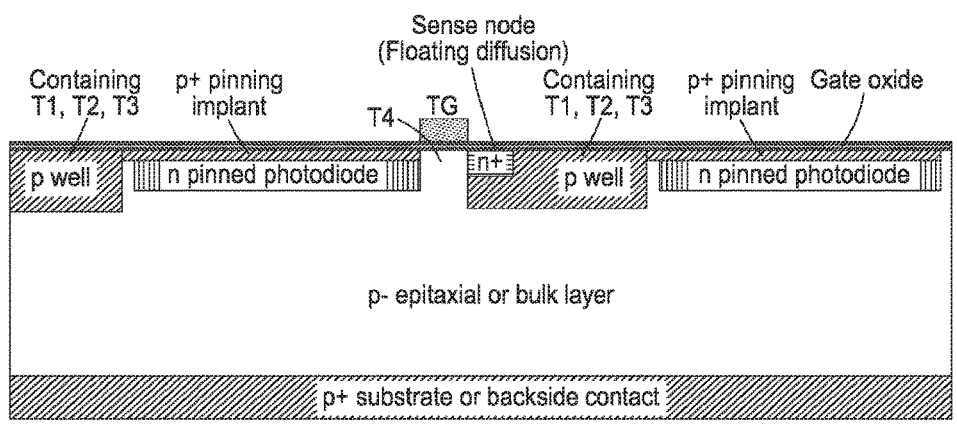
FIG. 6 is a cross-section diagram of the known CMOS image sensor of FIG. 2 using a pinned photodiode.
Figure 20:
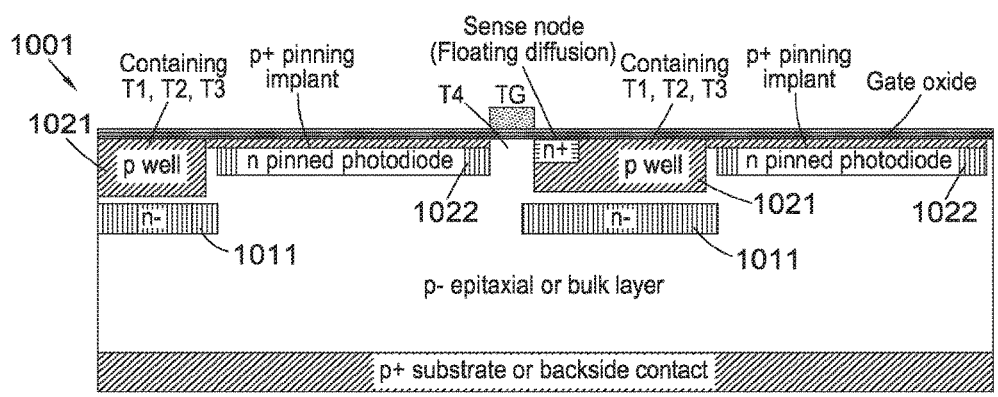
FIG. 20 is a cross-section diagram of a CMOS image sensor according to the invention comprising a pinned photodiode.

FIG. 20 shows a cross-section of an image sensor 1001 comprising pinned photodiodes 1022 and buried n-layers 1011 below p wells 1021. Otherwise the image sensor is similar to the prior art sensor of FIG. 6.

Figure 7:
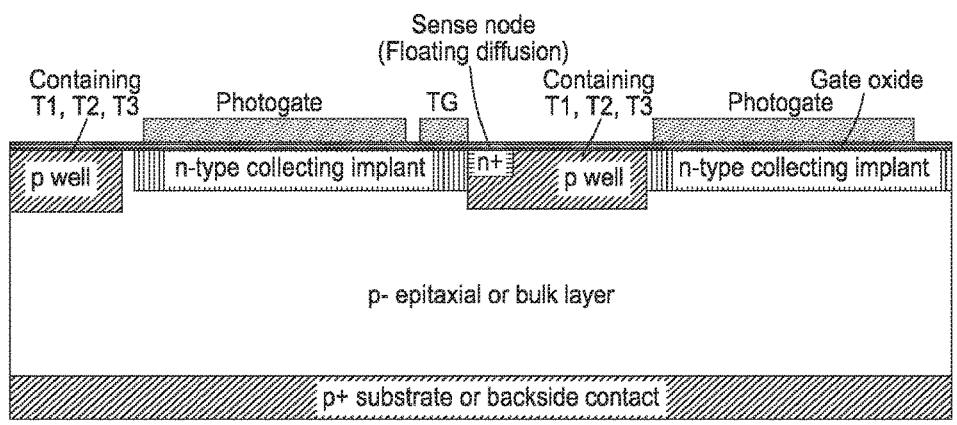
FIG. 7 is a cross-section diagram of the known CMOS image sensor of FIG. 3 using a photogate.
Figure 8:
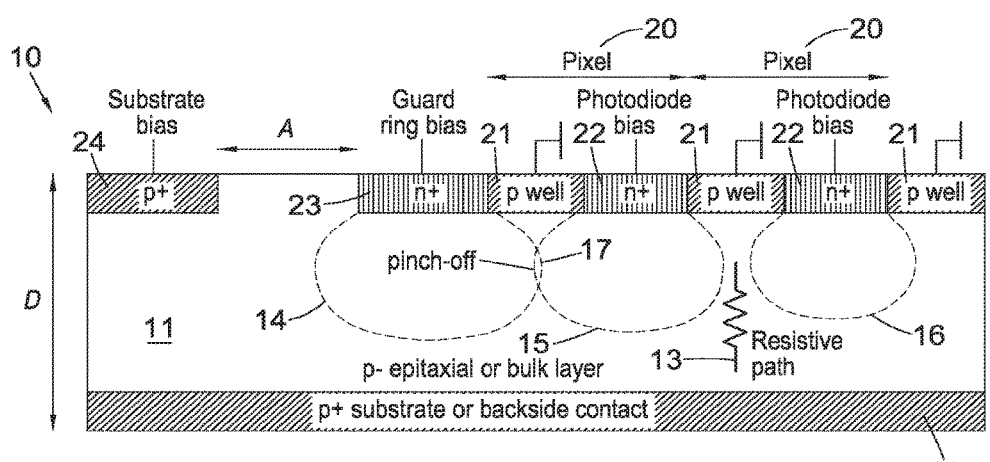
FIG. 8 is a cross-section diagram of a known CMOS image sensor with equal depth p wells and n wells.
Figure 9:
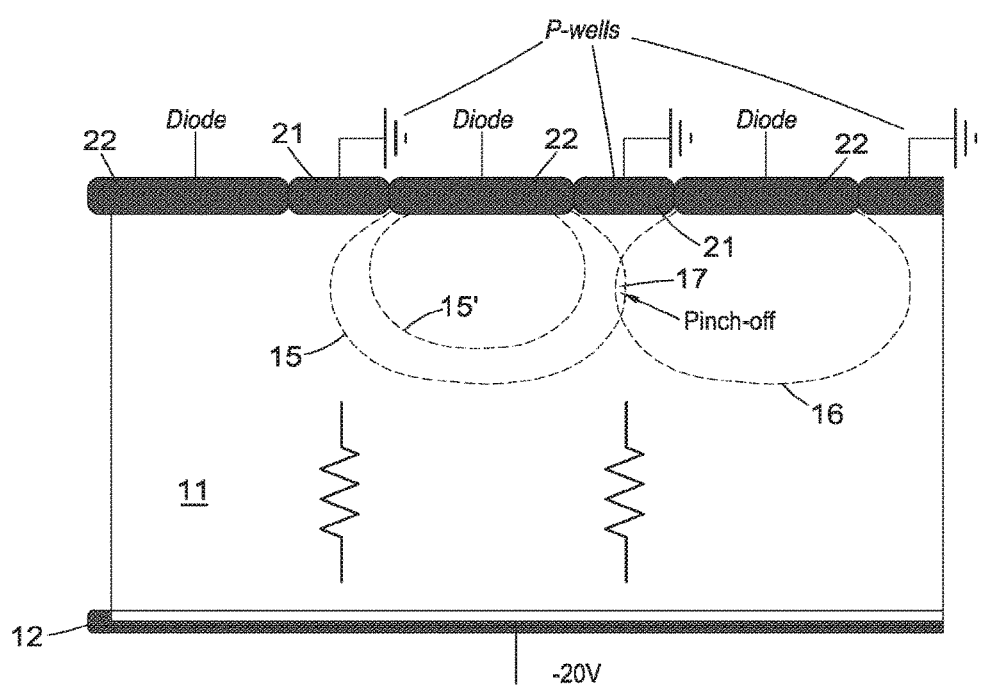
FIG. 9 is a cross-section of the known CMOS image sensor of FIG. 8 showing variations in the extent of a depletion zone.
Figure 10:
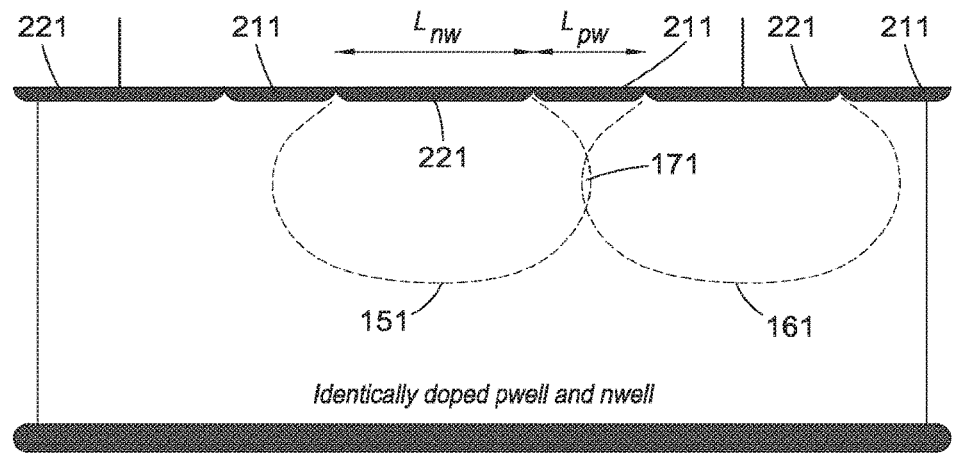
FIG. 10 is a cross-section of a known CMOS image sensor with identically doped equal depth p wells and n wells.
Figure 11:
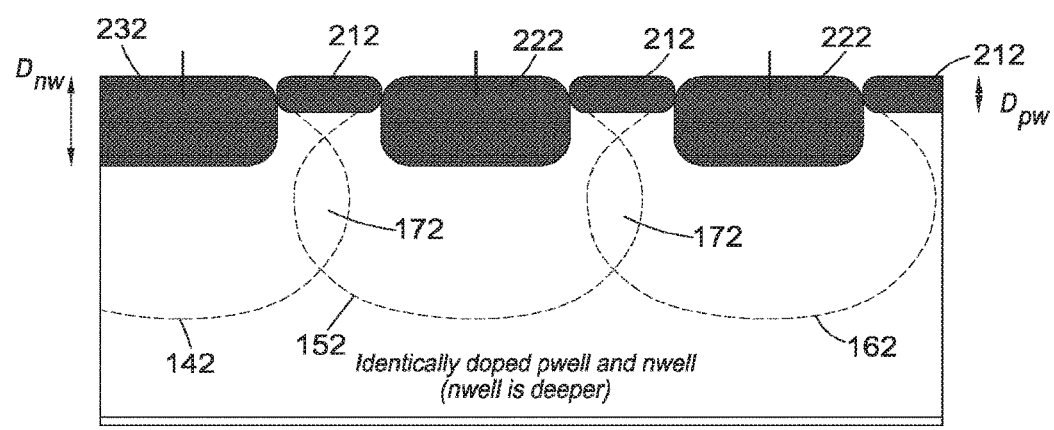
FIG. 11 is a cross-section of a known CMOS image sensor with identically doped but unequal depth p wells and n wells.
Figure 21:
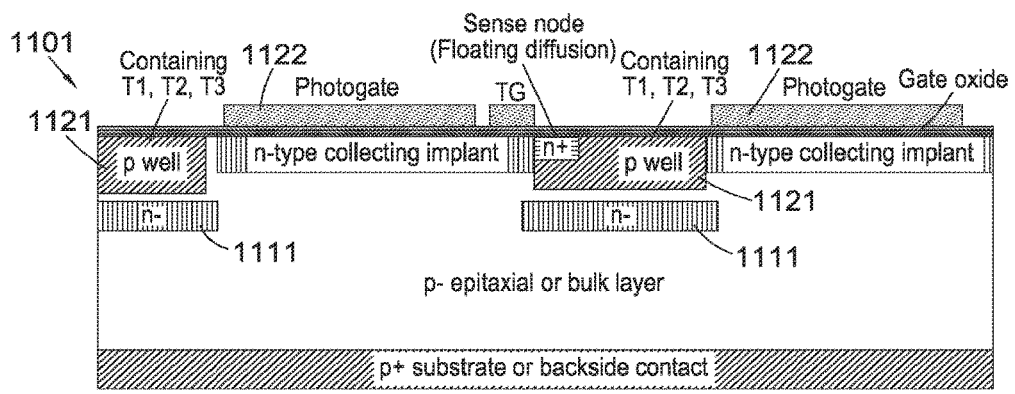
FIG. 21 is a cross-section diagram of a CMOS image sensor according to the invention comprising a photogate.

FIG. 21 shows a cross-section of an image sensor 1101 comprising photogates 1122 and buried n-layers 1111 below p wells 1121. Otherwise the image sensor is similar to the prior art sensor of FIG. 7.

Figure 22:
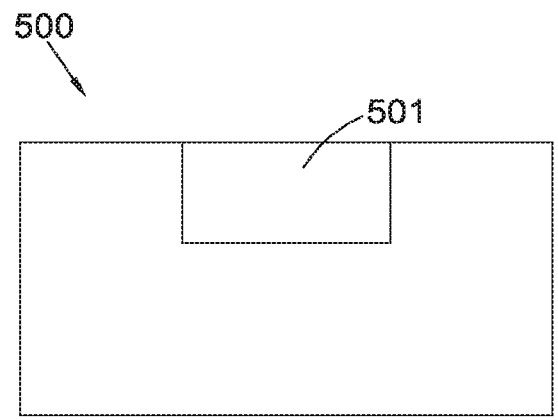
FIG. 22 is a schematic diagram of an apparatus comprising an image sensor according to the invention.

FIG. 22 is a schematic figure of an apparatus 500 incorporating an image sensor 501 according to the invention.

Figure 23:
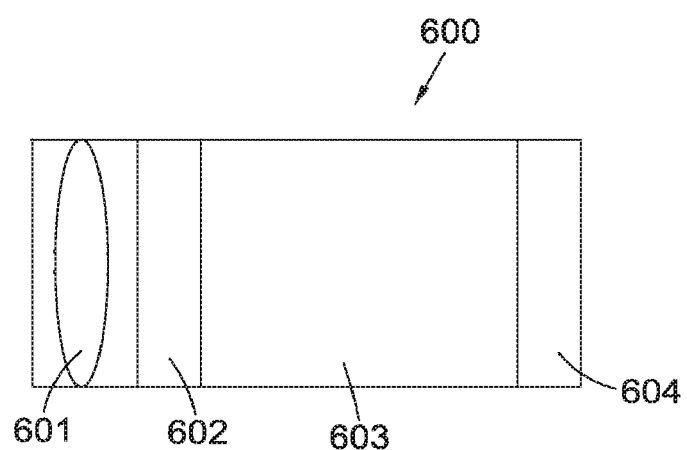
FIG. 23 is a schematic diagram of a night vision apparatus comprising an image sensor according to the invention.

FIG. 23 is a schematic figure of a night vision apparatus 600 comprising an objective lens 601 or other image forming means, an image sensor 602 according to the invention, a processing module 603 for processing signals from the image sensor 602 for presentation on a display means 604.

It will be understood that in the described CMOS image sensor the active devices in the p well are protected by the p well from charge carriers generated in the epitaxial or bulk layer by incident electromagnetic radiation.

The image sensor of the invention has the advantage of being compatible with a CMOS manufacturing process. The invention requires only on additional processing step available in most CMOS manufacturing plants to create the floating buried deep implants of a type. The structures of the prior art require more and more expensive manufacturing steps than the present invention.

The invention has the advantage of completely avoiding interaction with the delicate structure of a pinned photodiode.

The invention has particular applications in night vision applications using a red glow of the night sky and in infrared and x-ray astronomy.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A CMOS image sensor comprising:
   an active layer of a first conductivity type arranged to be reversed biased and a pixel comprising:
   a photosensitive element comprising a well of a second conductivity type, wherein a depletion region is formed, wherein, in use, the active layer is reverse biased, in the active layer below the photosensitive element; and
   a well of the first conductivity type containing active CMOS elements for reading and resetting the photosensitive element; and
   a doped buried layer of the second conductivity type located entirely within the active layer directly beneath the well of the first conductivity type arranged to extend the depletion region in the active layer so that the depletion region is extended below the well of the second conductivity type and also below the well of the first conductivity type;
   wherein the extended depletion region in the active layer is arranged to pinch off a parasitic current path between the well of the first conductivity type containing active CMOS elements and a substrate or backside contact;
   wherein the doped buried layer is electrically floating and a width of the doped buried layer of the second conductivity type is at least equal to a width of the well of the first conductivity type;
   wherein a depth of the buried layer is between 2 to 3 µm and is deeper than a depth of the well of the first conductivity type.

2. A CMOS image sensor as claimed in claim 1 wherein the doped buried layer has a doping level of $10^{15}$ cm$^{-3}$ and the active layer has a doping level of $10^{13}$ cm$^{-3}$.

3. A CMOS image sensor as claimed in claim 1, further comprising a plurality of pixels as claimed in claim 1 and a guard ring comprising a well of the second conductivity type at least substantially encircling the plurality of pixels.

4. A CMOS image sensor as claimed in claim 1, wherein the pixel is on a front face of the substrate and the CMOS image sensor is arranged for illumination on the back face thereof, opposed to the front face.

5. A CMOS image sensor as claimed in claim 4, further comprising a contact on the back face arranged for applying the reverse bias to the CMOS image sensor.

6. A CMOS image sensor as claimed in claim 4, further comprising a contact on the front face arranged for applying the reverse bias to the CMOS image sensor.

7. A CMOS image sensor as claimed in claim 1, wherein the photosensitive element comprises one of a photodiode, a buried photodiode, a pinned photodiode or a photo gate.

8. An apparatus comprising a CMOS image sensor comprising:
   an active layer of a first conductivity type arranged to be reversed biased and a pixel comprising:
   a photosensitive element comprising a well of a second conductivity type, wherein a depletion region is formed, wherein, in use, the active layer is reverse biased, in the active layer below the photosensitive element; and
   a well of the first conductivity type containing active CMOS elements for reading and resetting the photosensitive element; and
   a doped buried layer of the second conductivity type located entirely within the active layer directly beneath the well of the first conductivity type arranged to extend the depletion region in the active layer so that the depletion region is extended below the well of the second conductivity type and also below the well of the first conductivity type;
   wherein the extended depletion region in the active layer is arranged to pinch off a parasitic current path between the well of the first conductivity type containing active CMOS elements and a substrate or backside contact;
   wherein the doped buried layer is electrically floating and a width of the doped buried layer of the second conductivity type is at least equal to a width of the well of the first conductivity type;
   wherein a depth of the buried layer is between 2 to 3 µm and is deeper than a depth of the well of the first conductivity type.

9. A night vision apparatus comprising a CMOS image sensor comprising:
   an active layer of a first conductivity type arranged to be reversed biased and a pixel comprising:
   a photosensitive element comprising a well of a second conductivity type, wherein a depletion region is formed, wherein, in use, the active layer is reverse biased, in the active layer below the photosensitive element; and
   a well of the first conductivity type containing active CMOS elements for reading and resetting the photosensitive element; and
   a doped buried layer of the second conductivity type located entirely within the active layer directly beneath the well of the first conductivity type arranged to extend the depletion region in the active layer so that the depletion region is extended below the well of the second conductivity type and also below the well of the first conductivity type;
   wherein the extended depletion region in the active layer is arranged to pinch off a parasitic current path between the well of the first conductivity type containing active CMOS elements and a substrate or backside contact;
   wherein the doped buried layer is electrically floating and a width of the doped buried layer of the second conductivity type is at least equal to a width of the well of the first conductivity type;
   wherein a depth of the buried layer is between 2 to 3 µm and is deeper than a depth of the well of the first conductivity type.

* * * * *